(12) United States Patent
Chan

(10) Patent No.: US 6,686,541 B2
(45) Date of Patent: Feb. 3, 2004

(54) CABLE MANAGEMENT DEVICE FOR RACK MOUNTED EQUIPMENT

(75) Inventor: Johni Chan, Rancho Santa Fe, CA (US)

(73) Assignee: I-Bus Corporation, San Jose, CA (US)

( * ) Notice: Subject to any disclaimer, the term of this patent is extended or adjusted under 35 U.S.C. 154(b) by 0 days.

(21) Appl. No.: 10/065,186

(22) Filed: Sep. 25, 2002

(65) Prior Publication Data

US 2003/0079901 A1 May 1, 2003

Related U.S. Application Data

(60) Provisional application No. 60/343,390, filed on Oct. 18, 2001.

(51) Int. Cl.⁷ .................................................. H02G 3/04
(52) U.S. Cl. .................... 174/72 A; 174/68.1; 361/825; 361/826; 379/327
(58) Field of Search ................................ 174/48, 65 G, 174/68.1, 69, 72 A, 98, 99 R, 100; 211/26, 189; 361/825, 826, 827, 829, 683; 379/327; 385/134, 135; 439/719; D13/155

(56) References Cited

U.S. PATENT DOCUMENTS

| | | | | |
|---|---|---|---|---|
| 5,642,258 A | * | 6/1997 | Barrus et al. ............... 361/683 |
| 5,921,402 A | * | 7/1999 | Magenheimer ............. 211/26 |
| 6,102,214 A | * | 8/2000 | Mendoza .................... 211/26 |
| 6,170,784 B1 | * | 1/2001 | MacDonald et al. .......... 248/65 |
| 6,315,249 B1 | * | 11/2001 | Jensen et al. ................. 248/65 |
| 6,327,139 B1 | * | 12/2001 | Champion et al. .......... 361/608 |
| 6,365,834 B1 | * | 4/2002 | Larsen et al. ............... 174/100 |
| 6,380,484 B1 | * | 4/2002 | Theis et al. ................. 174/68.3 |
| 6,468,112 B1 | * | 10/2002 | Follingstad et al. ........ 439/719 |
| 6,489,565 B1 | * | 12/2002 | Krietzman et al. ......... 174/101 |

* cited by examiner

Primary Examiner—Dean A. Reichard
Assistant Examiner—Adolfo Nino
(74) Attorney, Agent, or Firm—Thomas F. Lebens; Fitch, Even, Tabin & Flannery

(57) ABSTRACT

A cable management device includes a cable management channel having a cable rest slot for routing a cable into and out of the cable management channel and a mounting bracket coupled to the cable management channel for fastening the cable management channel to a surface, such as an equipment enclosure rail, and for moving the cable management channel and the cable between a first position and a second position. The cable management channel may be advantageously released from the mounting bracket for moving the cable management channel between the first position and the second position to service an area of the equipment enclosure normally covered by the cable management channel. Alternatively, the cable management channel may be rotated on the mounting bracket to move the cable management channel away from the area of the equipment enclosure normally covered by the cable management channel.

22 Claims, 3 Drawing Sheets

CABLE MANAGEMENT DEVICE FOR RACK MOUNTED EQUIPMENT

CROSS REFERENCE TO RELATED APPLICATIONS

This patent application claims priority under 35 U.S.C. §119(e) to U.S. Provisional Patent Application No. 60/343, 390 for CABLE MANAGEMENT DEVICE FOR RACK MOUNTED EQUIPMENT, filed Oct. 18, 2001, by Johni Chan, incorporated herein by reference.

BACKGROUND OF INVENTION

Field of the Invention

The present invention relates generally to routing a number of cables between components at various locations. More specifically, but without limitation thereto, the present invention relates to a cable management device for rack mounted equipment.

SUMMARY OF INVENTION

In one aspect of the present invention, a cable management channel may be conveniently removed from an area normally covered by the cable management channel without having to untie or detach cables, for example, to provide access to equipment located behind the cable management channel. In one embodiment, a cable management device includes a cable management channel having at least one cable routing slot for routing a cable in and out of the cable management channel, a cable retainer for holding the cable inside the cable management channel, and a mounting bracket coupled to the cable management channel for fastening the cable management channel to a surface, such as an equipment rack enclosure rail, and for moving the cable management channel and the cable between a first position and a second position. The cable management channel may be advantageously released from the mounting bracket for moving the cable management channel between the first position and the second position to service an area of the equipment enclosure normally covered by the cable management channel. Alternatively, the cable management channel may be rotated on the mounting bracket to move the cable management channel away from the area of the equipment enclosure normally covered by the cable management channel. In the first position, the cable management channel may cover an area directly in front of the equipment rack enclosure. In the second position, the cable management channel may be located a distance away from the area directly in front of the equipment rack enclosure, for example, to provide access to the area directly behind the cable management channel that is covered by the cable management channel in the first position. The mounting bracket may be coupled to the cable management channel so that the cable management channel may be released from the mounting bracket, or the mounting bracket may be coupled so that the cable management channel may be rotated on the mounting bracket to move the cable management channel between the first position and the second position. A cable hitching slot may also be formed in the cable management channel for inserting and replacing cables without having to thread an end of the cable through the cable management channel.

BRIEF DESCRIPTION OF DRAWINGS

The present invention is illustrated by way of example and not limitation in the accompanying figures, in which like references indicate similar elements throughout the several views of the drawings, and in which.

Elements in the figures are illustrated for simplicity and clarity and have not necessarily been drawn to scale. For example, the dimensions of some of the elements in the figures may be exaggerated relative to other elements to help to improve understanding of the following description of the illustrated embodiments.

DETAILED DESCRIPTION

Figure 1:
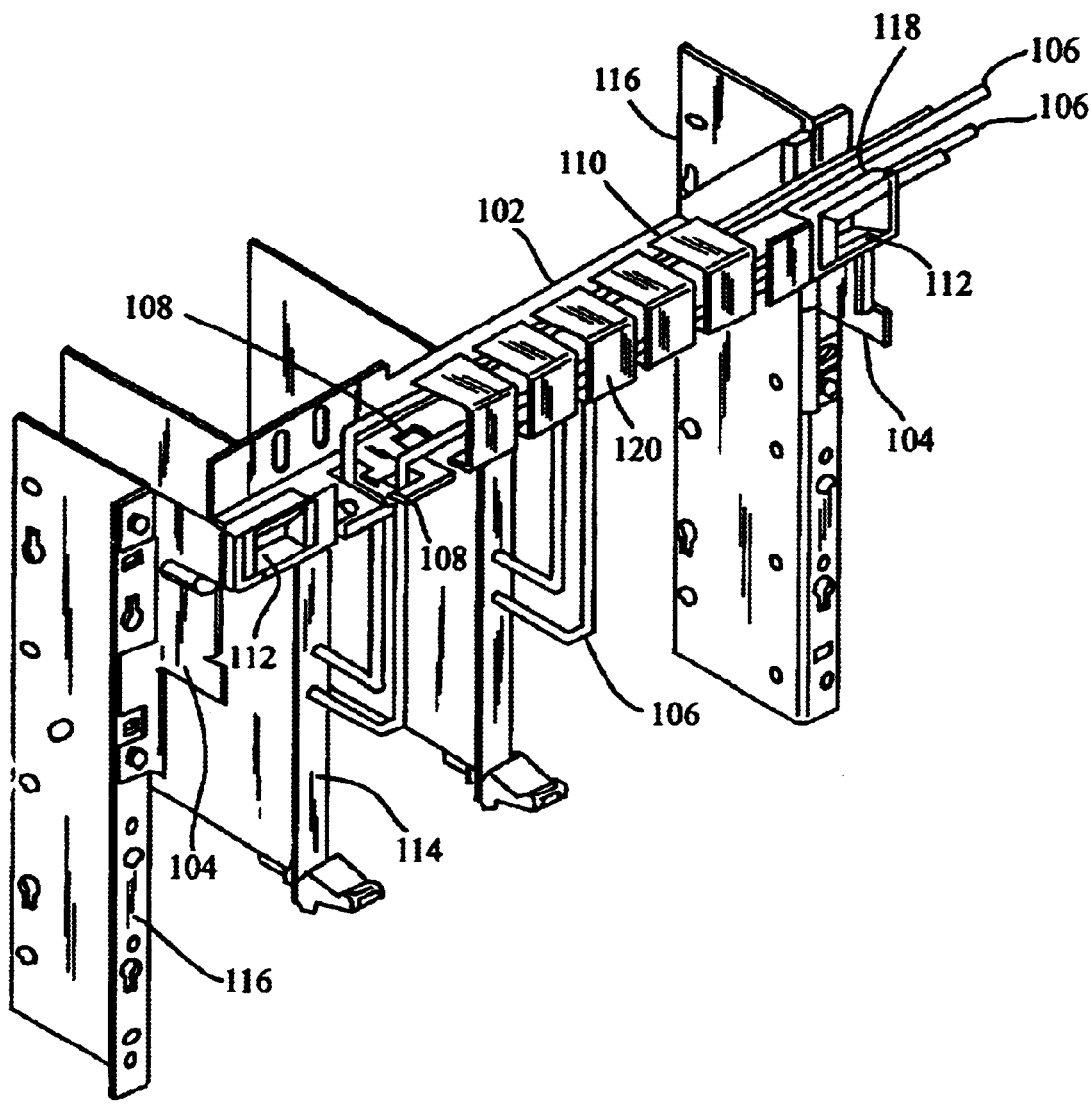
FIG. 1 illustrates a cable management device that includes a mounting bracket release according to an embodiment of the present invention.

FIG. 1 illustrates a cable management device that includes a detachable mounting bracket according to an embodiment of the present invention. Shown in FIG. 1 are a cable management channel 102, mounting brackets 104, cables 106, cable rest slots 108, a cable hitching slot 110, channel latches 112, plug-in modules 114, equipment enclosure rails 116, an end slot 118, and cable retainers 120.

In a typical configuration of modular electronic hardware in applications such as telecommunications, a number of plug-in modules 114 are connected by cables 106 that are attached to the front of the plug-in modules 114, typically by cable connectors (not shown).

As the number of cables 106 increases, it becomes increasingly difficult to keep the cables 106 organized in a manner that does not interfere with replacing failed plug-in modules 114 or with servicing other equipment such as fan assemblies (not shown) that may be mounted on the equipment enclosure rails 116 above and below the plug-in modules 114. For example, cable ties are commonly used to bundle cables 106 into harnesses. Several cable ties may have to be cut to move the harness away from the area covered by the harness if access to a module or to other equipment behind a cable becomes necessary, and afterward the cable ties have to be replaced. In the arrangement of FIG. 1, however, the cables 106 are advantageously bundled inside the cable management channel 102. The cable management channel 102 may be released from the mounting brackets 104 by the channel latches 112 to move the cables 106 away from the area over the plug-in modules 114 covered by the cables 106, for example, to provide access to equipment located behind the cables 106.

The equipment enclosure rails 116 may be, for example, industry standard 19-inch rack mount rails such as found in commercially manufactured electronic equipment enclosures. The plug-in modules 114 may be mechanically supported and electrically connected by, for example, a standard, commercially manufactured rack mounted chassis (not shown). The cable management channel 102 is supported on the equipment enclosure rails 116 by the mounting brackets 104, preferably so that the cable management channel 102 does not block access to the plug-in modules 114, however the cable management channel 102 may also be fastened to the equipment enclosure rails 116 by the mounting brackets 104 in other positions and orientations to suit specific applications. The mounting brackets 104 may be fastened to the equipment enclosure rails 116, for example, by screws, welding, or other well known fastening methods. In this example, the mounting brackets 104 are fastened to the equipment enclosure rails 116 directly above the plug-in modules 114 by screws.

Each of the cables 106 is terminated at one end of a plug-in module 114, preferably by a connector (not shown) that may be conveniently attached and released from the plug-in module 114. Each of the cables 106 may be conveniently routed through one of the cable rest slots 108 and into the cable management channel 102 through the cable hitching slot 110. In this example, each of the cable rest slots 108 is formed in the bottom of the cable management channel 102. A first portion of the cable rest slot 108 extends from the front of the cable management channel 102 toward the back of the cable channel 102, and a second portion of the cable rest slot 108 extends from the first portion in a direction parallel to the cable management channel 102. A vertical section of each of the cables 106 is inserted from the front through the first portion of a cable rest slot 108 and is held inside the cable management channel 102 by the second portion of the cable rest slot 108. Each of the cables 106 is then routed through the cable management channel 102 and may be routed out of the cable management channel 102 through either another cable rest slot 108 to a plug-in module 114 or through the end slot 118 formed in the mounting brackets 104 at one or both ends of the cable management channel 102. The cable rest slot 108 may also be formed with additional second portions to accommodate additional cables 106. In the example illustrated, there are two second portions formed for each of the cable rest slots 108, and one of the cables 106 is routed through each of the second portions. In other embodiments, multiple cables may be routed through a second portion of a cable rest slot 108.

The cable hitching slot 110 is a gap formed between the back of the cable management channel 102 and each of the cable retainers 120 along the length of the cable management channel 102 that allows the cables 106 to be inserted or replaced in the cable management channel 102 over the cable retainers 120 without having to pull an end of a cable 106 through the cable management channel 102. This feature avoids the necessity of having to remove connectors from the cables 106 to thread them through the cable management channel 102.

In the event that access to the area behind the cable management channel 102 is desired, the channel latches 112 may be actuated according to well known techniques to release the cable management channel 102 from the mounting brackets 104. The cable management channel 102 may then be pulled away from the area behind the cable management channel 102. In this example, the cable management channel 102 may be parked in a lower position on the mounting brackets 104 while the equipment in the area above the plug-in modules 114 is being serviced. Afterward, the cable management channel 102 may be refastened to the mounting brackets 104 by the channel latches 112.

The cable management channel 102 and the mounting brackets 104 may be made of a metal or plastic material formed according to well known techniques.

Figure 2:
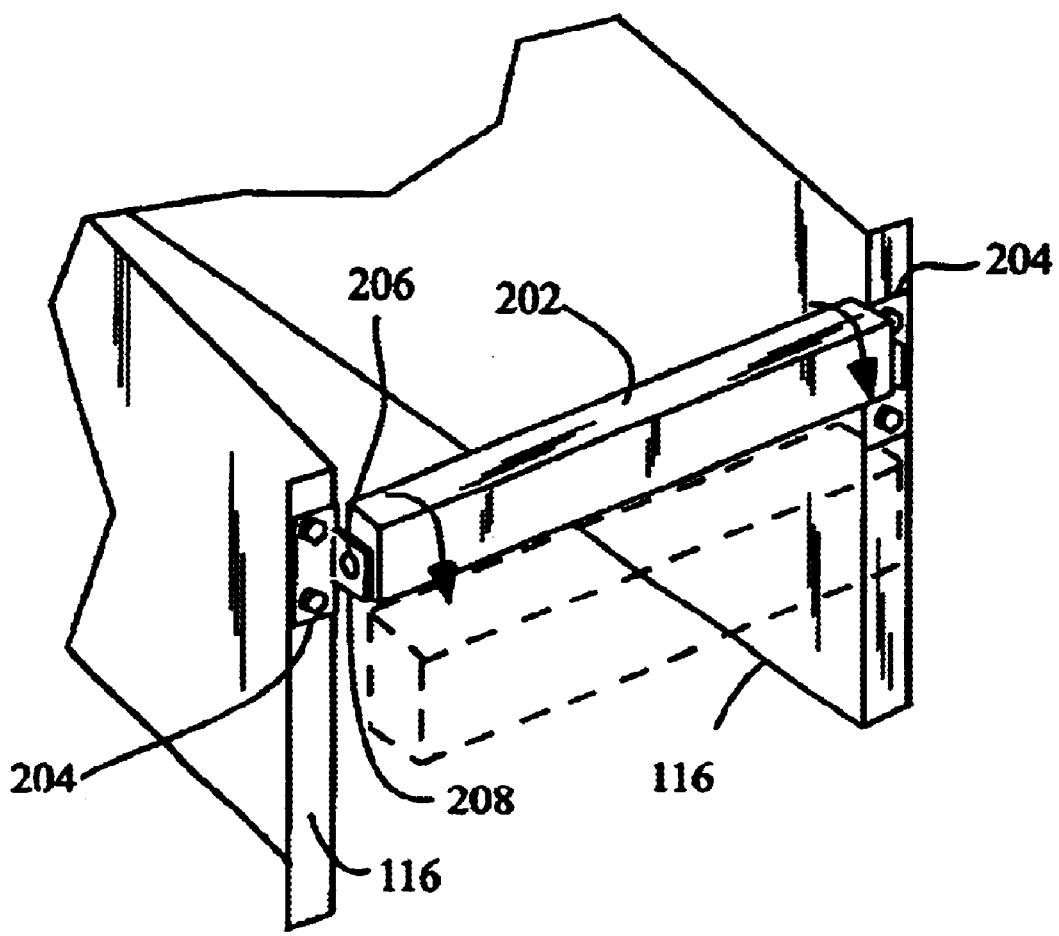
FIG. 2 illustrates a cable management device that includes a mounting bracket pivot according to an embodiment of the present invention.

FIG. 2 illustrates a cable management device that includes a pivoted mounting bracket according to an embodiment of the present invention. Details similar to the embodiment illustrated in FIG. 1 have been omitted to simplify the illustration of each of the pivoted mounting brackets 204.

In this example, no channel latches are included on the cable management channel 202. Instead, the cable management channel 202 is moved away from the area behind the cable management channel 202 by rotating the cable management channel 202 on the pivoted mounting brackets 204 between a first position in front of the area behind the cable management channel 202 and a second position (shown in dashed lines) away from the area behind the cable management channel 202. Each of the pivoted mounting brackets 204 includes a pivot or swivel 206 attached to an arm 208. The arm 208 is formed on or fastened to the cable management channel 202. Detents or other devices may be included in the pivoted mounting brackets 204 according to well known techniques to prevent the cable management channel 202 from rotating on the mounting brackets 204 accidentally.

Figure 3:
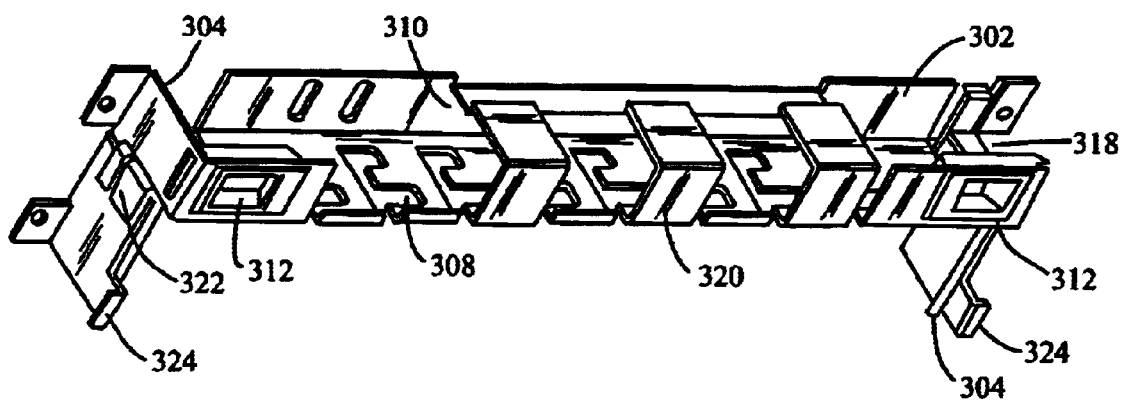
FIG. 3 illustrates a cable management device that includes a mounting bracket release and a parking tab according to an alternative embodiment of the present invention.

FIG. 3 illustrates a cable management device according to an alternative embodiment of the present invention. Shown in FIG. 3 are a cable management channel 302, mounting brackets 304, cable rest slots 308, a cable hitching slot 310, channel latches 312, an end slot 318, cable retainers 320, parking slots 322, and parking tabs 324.

The cable management channel 302 is supported on the equipment enclosure rails (not shown) by the mounting brackets 304 as described with regard to FIG. 1. In this example, the cable retainers 320 are spaced apart between the cable rest slots 308 along the length of the cable management channel 302 to facilitate routing of the cables 106 through the cable rest slots 308. The cable hitching slot 310 allows the cables 306 to be inserted or replaced in the cable management channel 302 over the cable retainers 320.

In the event that access to the area behind the cable management channel 302 is desired, the channel latches 312 may be actuated according to well known techniques to release the cable management channel 302 from the mounting brackets 304. The cable management channel 302 may then be removed from a first position on the mounting brackets 304 and parked in a second position by hooking the parking slots 322 on either side of the cable management channel 302 over the parking tabs 324 formed on the lower portion of the mounting brackets 304. The cable management channel 302 may be refastened to the mounting brackets 304 by the channel latches 312. Alternatively, the cable management channel 302 may be pivoted on mounting brackets as described with regard to FIG. 2.

While the invention herein disclosed has been described by means of specific embodiments and applications thereof, numerous modifications and variations could be made thereto by those skilled in the art without departing from the scope of the invention set forth in the following claims.

What is claimed is:

1. A cable management device comprising:
   a cable management channel having at least one cable rest slot formed therein for routing a cable in or out of the cable management channel other than at either end of the cable management channel; and
   a mounting bracket coupled to the cable management channel for moving the cable management channel and the cable between one of a first position and a second position.

2. The cable management device of claim 1 further comprising a, latch coupled to the cable management channel for releasing the cable management channel from the mounting bracket.

3. The cable management device of claim 1 wherein the mounting bracket comprises a parking tab for engaging a slot formed in the cable management channel to support the cable management channel in the second position.

4. The cable management device of claim 1 further comprising a pivot coupled to the mounting bracket for rotating the cable management channel between the first position and the second position.

5. The cable management device of claim 1 further comprising an end slot formed in at least one end of the cable management channel for routing the cable into or out of the at least one end of the cable management channel.

6. The cable management device of claim 1 further comprising a cable retainer coupled to the cable management channel for holding the cable in the cable management channel.

7. The cable management device of claim 6 further comprising a hitching slot coupled to the cable management channel for routing the cable over the cable retainer and into the cable management channel.

8. The cable management device of claim 1 further comprising a cable rest slot formed in the cable management channel for receiving a vertical portion of the cable.

9. The cable management device of claim 8 wherein the cable rest slot comprises a first portion that extends from a front side of the cable management channel toward a back side of the cable management channel and a second portion that extends from the first portion parallel to the cable management channel for holding the cable inside the cable management channel.

10. A cable management device comprising:
cable management channel means for routing a cable in or out Of the cable management channel means other than at either end of the cable management channel means; and
mounting bracket means coupled to the cable management channel means for fastening the cable management channel means to a surface and for supporting the cable management channel means in one of a first position and a second position.

11. The cable management device of claim 10 further comprising latch means coupled to the cable management channel means for releasing the cable management channel means from the mounting bracket means.

12. The cable management device of claim 10 wherein the mounting bracket means comprises parking tab means to support the cable management channel means in the second position.

13. The cable management device of claim 10 further comprising pivot means coupled to the mounting bracket means for rotating the cable management channel means between the first position and the second position.

14. The cable management device of claim 10 further comprising cable retainer means coupled to the cable management channel means for holding the cable in the cable management channel.

15. The cable management device of claim 14 further comprising hitching slot means coupled to the cable retainer means for inserting and removing the cable from the cable management channel means.

16. The cable management device of claim 10 further comprising cable rest slot means coupled to the cable management channel means for receiving a vertical portion of the cable.

17. A method for cable management comprising:
routing a cable in or out of a cable management channel other than at either end of the cable management channel; and
moving the cable management channel and the cable between one of a first position and a second position.

18. The method of claim 17 further comprising releasing time cable management channel from a mounting bracket.

19. The method of claim 17 further comprising rotating the cable management channel between the first position and the second position.

20. The method of claim 17 further comprising holding the cable in the cable management channel by a cable retainer.

21. The method of claim 17 further comprising routing the: cable over the cable retainer and into the cable management channel.

22. The method of claim 17 further comprising receiving a vertical portion of the cable in a cable rest slot.

* * * * *

UNITED STATES PATENT AND TRADEMARK OFFICE
CERTIFICATE OF CORRECTION

PATENT NO. : 6,686,541 B2  
DATED : February 3, 2004  
INVENTOR(S) : Johni Chan

It is certified that error appears in the above-identified patent and that said Letters Patent is hereby corrected as shown below:

<u>Column 5,</u>
Line 26, change "Of" to -- of --; and

<u>Column 6,</u>
Line 27, change "time" to -- the --.

Signed and Sealed this

Twenty-fifth Day of May, 2004

JON W. DUDAS
*Acting Director of the United States Patent and Trademark Office*